(12) United States Patent
Locher et al.

(10) Patent No.: US 6,495,216 B2
(45) Date of Patent: Dec. 17, 2002

(54) APPARATUS AND METHOD FOR ELECTRON BEAM EVAPORATION

(75) Inventors: Stefan Locher, Alzenau (DE); Eckhard Wirth, Gelnhausen (DE)

(73) Assignee: Leybold Optics GmbH, Alzenau (DE)

( * ) Notice: Subject to any disclaimer, the term of this patent is extended or adjusted under 35 U.S.C. 154(b) by 0 days.

(21) Appl. No.: 08/876,887

(22) Filed: Jun. 16, 1997

(65) Prior Publication Data

US 2001/0006708 A1 Jul. 5, 2001

(30) Foreign Application Priority Data

Jun. 14, 1996 (DE) .......................... 196 23 701

(51) Int. Cl.⁷ .......................... C23C 14/30; C23C 14/56
(52) U.S. Cl. .................. 427/566; 118/723 EB; 118/727
(58) Field of Search ................. 427/566, 567; 118/723 EB, 727

(56) References Cited

U.S. PATENT DOCUMENTS

| | | | |
|---|---|---|---|
| 2,482,329 A | * 9/1949 | Dimmick | 118/727 |
| 3,389,210 A | 6/1968 | Whitson et al. | |
| 4,034,256 A | 7/1977 | Sommerkamp et al. | 313/440 |
| 4,115,653 A | 9/1978 | Kienel et al. | 13/31 |
| 4,143,272 A | 3/1979 | Frank | 250/425 |
| 4,197,175 A | * 4/1980 | Moll et al. | 427/566 |
| 4,561,382 A | * 12/1985 | Zeven | 118/727 |
| 4,776,299 A | * 10/1988 | Hill | 118/727 |
| 5,190,590 A | * 3/1993 | Suzuki et al. | 118/727 |
| 5,216,690 A | 6/1993 | Hanks | 373/10 |
| 5,288,328 A | * 2/1994 | Nouvelot et al. | 118/727 |
| 5,473,627 A | 12/1995 | Tsujimoto et al. | 373/11 |

FOREIGN PATENT DOCUMENTS

| | | | |
|---|---|---|---|
| DE | 123979 | 1/1977 | |
| DE | 2656314 | 6/1978 | H01J/37/24 |

OTHER PUBLICATIONS

351: Derwent WPI 1997; DE 2656314; Inventor: F Frank; Assignee: Leybold Heraeus GmbH & Co KG; Title: Power Supply System for Electron Gun; No Month with Abstract in English.

351: Derwent WPI No Month 1997; BE 843275 A; Assignee: Leybold Heraeus GmbH & Co KG; Title: Electron Gun for Heating, Melting and Evaporation; with Abstract in English.

* cited by examiner

Primary Examiner—Marianne Padgett
(74) Attorney, Agent, or Firm—Fulbright & Jaworski L.L.P.

(57) ABSTRACT

Disclosed is an electron beam evaporator for installation in a vacuum apparatus which provides for variable positioning during or between applications of a coating. The apparatus has a carrier plate which is a flat hollow body, the top cover plate of which supports the evaporator. The hollow body is disposed over the bore in the tank such that it can be turned about the main axis of the bore. The component assemblies of the electron beam evaporator are vacuum-tight on the cover plate and the connecting lines are carried through the interior of the hollow body to the component assemblies.

9 Claims, 3 Drawing Sheets

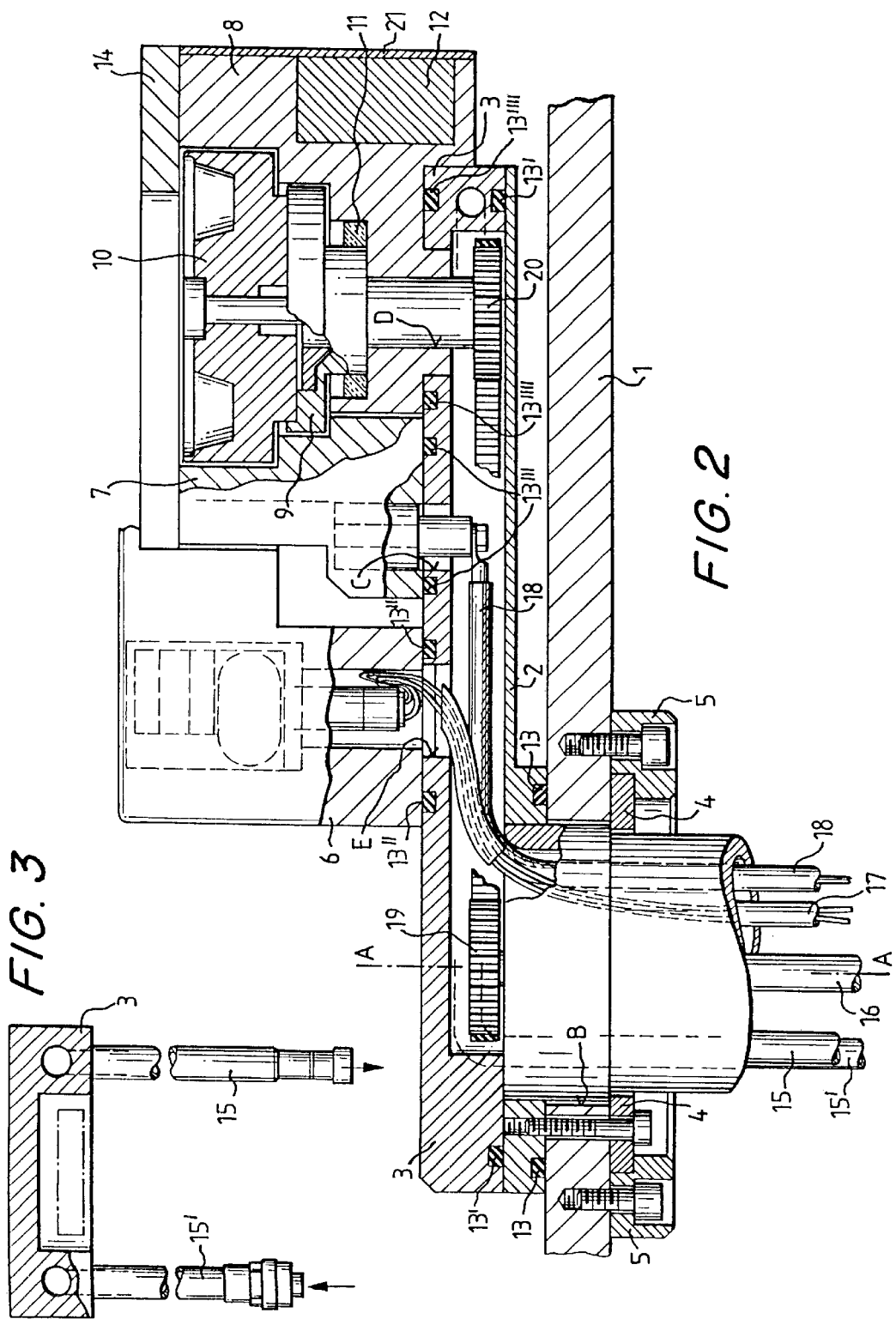

APPARATUS AND METHOD FOR ELECTRON BEAM EVAPORATION

BACKGROUND OF THE INVENTION

The invention relates to an electron-beam evaporator for vacuum coating apparatus as used, for example, in optics for tempering lenses or eyeglass lenses. For this purpose the substrates to be coated are moved on an appropriate substrate holder over the vapor source heated by the electron beam, and are thus coated. The evaporation point from which the vapor is released is usually off-center from the main axis of rotation of the substrate holder.

The multiplicity of different substrate shapes and surface curvatures call for special efforts to achieve the desired coating thickness tolerances and coating thickness distribution within a batch on the substrate holder in the vapor coating apparatus. Another difficulty consists in the various evaporation characteristics of the coating material in use. For this reason it is desirable to have a variable or adjustable positioning of the evaporation point with respect to the substrates being coated, so that an optimum evaporator position can be set for each substrate from and each coating material.

An electron beam gun that is movable within the vacuum is disclosed is German Auslegachrift 2I 18 082. A container to which the electron gun is fastened is connected to the atmosphere through a tube. The electron gun is part of the container wall. The tube is guided in the chamber wall and is longitudinally displaceable. Such an apparatus is not suitable for use in optical coating, since it is too expensive. The variable range for the positioning of the evaporation point in optical coating apparatus of the prior art is only around 0.05 to 0.5 m. Furthermore, the vapor coating of the tube and contamination of the optical coating by the hydraulic oil are troublesome.

In DE 28 49 933 an electron beam evaporator is described, which is composed of the three elements: radiation source, deflecting magnet and the mounting for the material to be evaporated. The three component elements are displaceable in their spacing from one another, so that the evaporator is adaptable to the particular application.

In DE 37 04 505 an insertion device for vacuum apparatus is described, which has a bipartite, jointed lever arm the inner part of which is configured as a gas-tight hollow body and contains the driving means for moving the insertion arm.

BRIEF DESCRIPTION OF THE DRAWINGS

FIG. 2 depicts cut-out views of components of the electron beam evaporator and of the flat hollow carrier plate of the apparatus of FIG. 1.

FIG. 3 depicts a cross-sectional view of water connection lines running into the flat hollow carrier plate.

The invention is addressed to the problem of installing an electron beam evaporator into a vapor coating apparatus such that the evaporation point can be adapted with little difficulty to various vapor coating conditions and substrate shapes without the need to remove the necessary connections and connecting lines.

The solution of the stated problem is accomplished by the invention in that:

a) The support plate is configured as a cover plate of a flat hollow body whose interior is in communication with the atmosphere through a bore in the tank.

b) The hollow body is placed over the bore in the tank such that it can be turned about the main axis of the bore.

c) The component assemblies of the electron beam evaporator are placed vacuum-tight on the mounting end of the hollow body.

d) All the connecting lines are carried through the interior of the hollow body to the component assemblies.

The invention makes it possible to optimize the evaporation point for every coating operation in a simple manner. By merely releasing the clamping ring the evaporator can be rotated about the main axis of the bore and thus achieve an optimum distribution of the coating thickness on the substrates.

With addition effort, an in situ adjustability without interrupting the vacuum might be possible, or even the intentional oscillation of the evaporation point by a rocking movement.

DETAILED DESCRIPTION OF THE INVENTION

Figure 1:
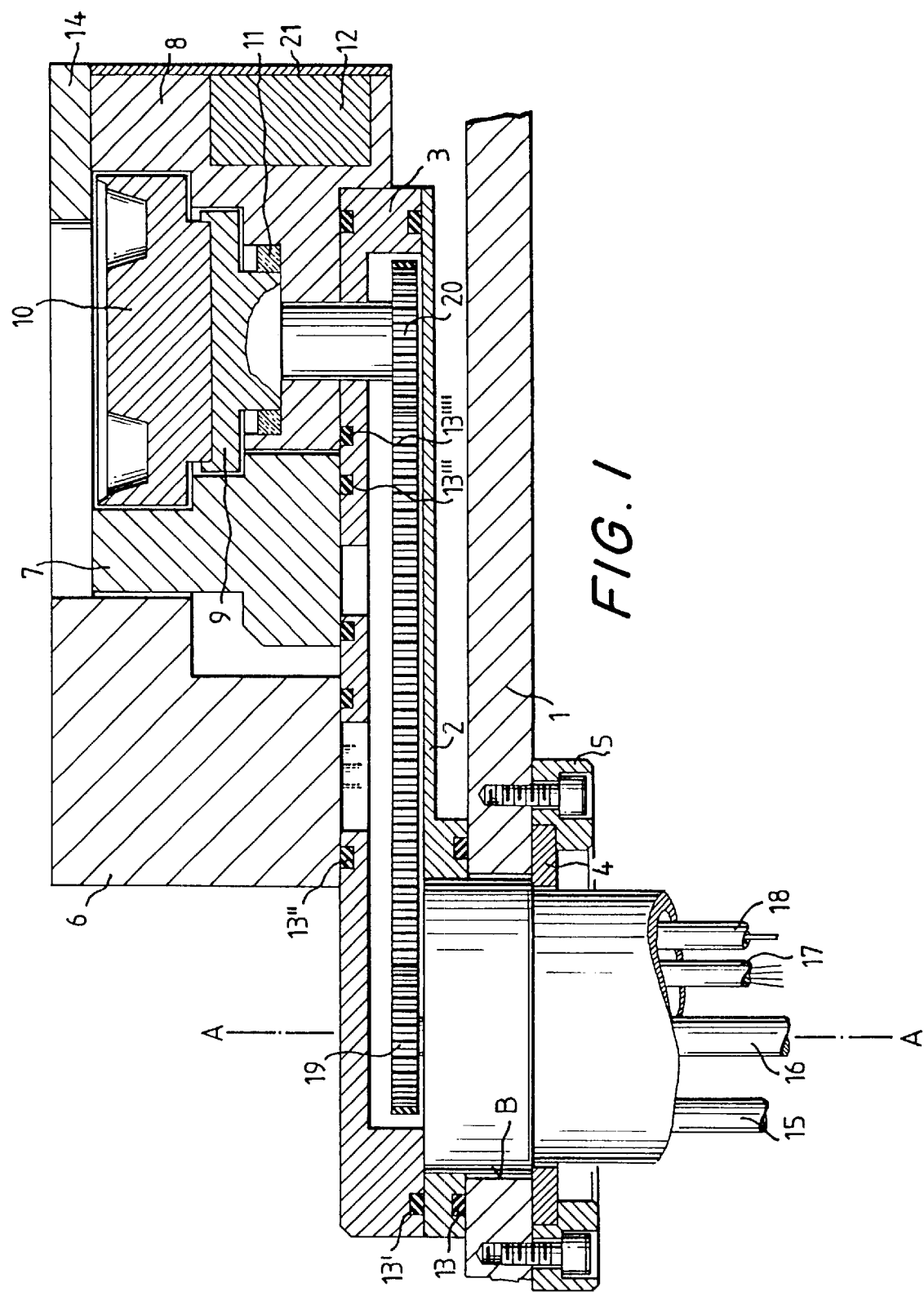
FIG. 1 depicts a side schematic view in cross section of the apparatus of the present invention.

The apparatus of the invention is represented in FIG. 1. The base plate 1 of the tank has a bore 22 which serves to hold the entire apparatus. The bearing plate 2 which is attached to base plate 1, is held to bore 22 by means of chamber flange 5 and counter-plate 4. Bearing plate 2 can be rotated about central axis 24 after loosening chamber flange 5. A cover plate 3 of channel-shaped cross section is placed on the bearing plate 2 in a vacuum-tight manner by means of the gasket 13'. The hollow space formed is in communication with the atmosphere and serves to accommodate the drive means and supply lines. Cover plate 3 and bearing plate 2 disposed to form a hollow interior therebetween comprise the carrier plate for the evaporator. FIG. 2 shows the apparatus of FIG. 1 with cut-out views of the components of the electron beam evaporator and the flat hollow carrier plate. The individual modules of the electron beam evaporator are sealed hermetically by O-rings on the upper, vacuum side. These modules are the deflecting unit 6 for x and y axis deflection of the electron beam, the cathode unit 7 with exchangeable beam generation, and the base unit 8 with exchangeable crucible 10.

The permanent magnet 12 protected by the cover plate 21 is let into the base unit 8 and produces the main magnetic field through pole shoes, not shown, for beam deflection. The rotary crucible 10 has a plurality of recesses which are protected by the cover plate 14 against undesired vapor desposition. The rotary crucible is driven via crucible drive 9 in a known manner through cogbelts by the sprockets 19 and 20 and a drive connected to the shaft 16. A sealing ring 11 forms the vacuum gasket. The connecting lines for water 15, deflection current 17 and high voltage 18 are passed through the bore 22 and corresponding openings in the cover plate 3 to their connection points. FIG. 3 shows an end view of lines 15' and 15 which are run from the hollow bore into the carrier plate. Since the connecting lines are in fixed positions on the atmosphere side within the hollow body formed by the bearing plate 2, the entire apparatus can be turned about the main axis 24, the screws in flange 5 are loosened to a degree sufficient to permit free rotation of the carrier plate. Bearing plate 2 can then be rotated as it slides on scaling 13 around axis 24. The system can thus be rotated for attachment to the desired position for coating. When flange 5 is tightened, counter-plate 4 engages against the bore, thereby holding the carrier plate having the evaporator thereon in a fixed position with respect to the bore. Sealing 13 is then made vacuum tight. Lines 15 to 18 are run inside the hollow interior of the carrier plate and are fixed at their connection points, but must tolerate some flexibility outside to allow a large rotational attachment on the order of 90 degrees or more. The rotational attachment around axis 24 supports the optimization of positioning the evaporation point of the a-gun in relation to various substrate geometries or substrate rotational drives for thickness uniformity of the coated layers.

By means of the length of the bearing plate 2 the apparatus can be adapted conveniently to the different receptacle diameters. The radial position of the evaporator with respect to the substrate cup can be adjusted conveniently through the turning angle. This is important for achieving a quick optimization of the coating thickness distribution.

The placement of the premounted system over bore 22 and insertion of lines 15 through 18 through bore 22 is performed during installation. After fixing, lines 15 to 18 are connected to their respective flexible counterpart and supply units.

Figure 4:
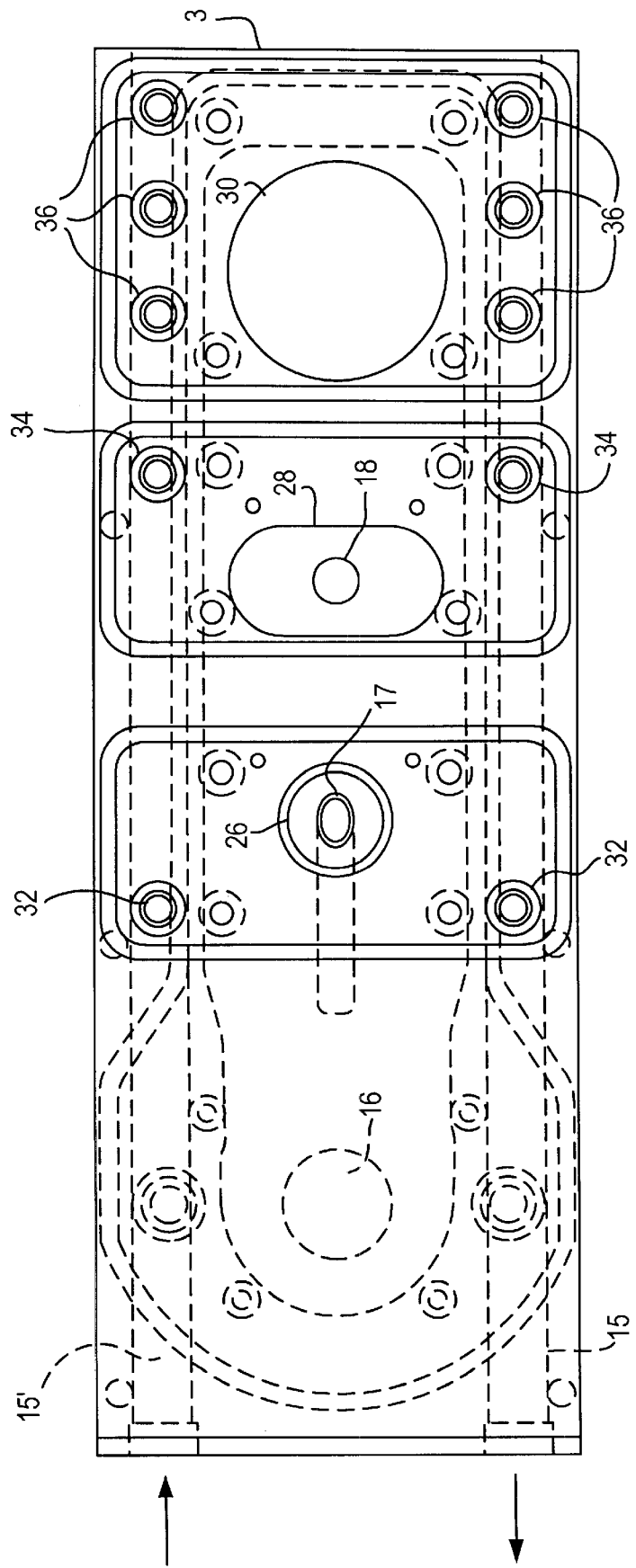
FIG. 4 depicts a top cross-sectional view of cover plate 3.

FIG. 4 is a top cross sectional view of cover plate 3. The belt drive runs in the central free space. Line 17 is a cable which has at least 4 wires for connection to deflection coils within unit 6 for x-y beam deflection. Line 17 runs through hole 26, shown in FIGS. 2 and 4, in top plate 3. High voltage connection line 18 runs inside cathode unit 7 via hole 28. Line 16 is the rotary shaft for the belt drive with sprockets 19 and 20 to rotate the multihearth crucible with vacuum/water rotary feedthrough which is mounted in hole 20. The arrows in FIG. 4 in and out indicate the direction of water flow. Water connections 15 and 15' for water out and in, respectively, are guided along both sides of the central belt drive and are connected on parallel loops to the individual components of the apparatus. Holes 32 permit water lines 15 and 15' to run from the hollow carrier plate through top plate 3 and connect to cathode unit 7. Holes 36 permit water lines 15 and 15' to run through top plate 3 and connect to base unit 8 and rotary crucible 10. At least two pairs of water lines run to base unit 8 and rotary crucible 10; three are shown in FIG. 3. Water cooling channels are attached to the individual components in ways which are contemplated by those in the art.

The terms and expressions which have been employed are used as terms of description and not limitation, and there is no intention in the use of such terms and expressions to exclude any equivalents of the features shown and described or portions thereof, it being recognized that various modifications are possible within the scope of the invention.

What is claimed is:

1. An electron beam evaporator unit with variable positioning for installation within a vacuum tank of a vacuum apparatus comprising:
    an electron beam evaporator; and
    a carrier plate;
    said electron beam evaporator comprising components:
        a) a beam generator;
        b) a deflection unit;
        c) a water-cooled crucible;
        d) fixed vacuum leadthroughs for supplying cooling water;
        e) a high voltage current receiver; and
        f) a low voltage current receiver;
    the electron beam evaporator being mounted on said carrier plate; wherein
        a) said carrier plate is a flat hollow body having an evaporator mounting end, the interior of said carrier plate in communication with the atmosphere through a bore (B) in the tank of a vacuum apparatus, the exterior of the carrier plate, when installed in the vacuum tank, being completely surrounded by the tank, the hollow body being positionable at the opposite end from the mounting end the bore (B) in the tank such that said carrier plate is rotatable in a vacuum tank about the main axis (A) through the center of the bore (B),
        b) said components of the electron beam evaporator are placed vacuum-tight on said mounting end of said carrier plate such that the components are offset from said axis (A); and
        c) said electron beam evaporator having supply lines for carrying cooling water to said fixed vacuum leadthroughs, a high voltage line for supplying said high voltage receiver, a low voltage line for providing low voltage to said low voltage receiver, and a crucible drive positioned in the interior of said hollow body.

2. The apparatus according to claim 1, wherein at least one of said supply lines is configured as a fixed vacuum lead-through.

3. The apparatus according to claim 2, wherein said components are assembled in a multipartite construction and individual components are replaceable with respective new components.

4. The electron beam evaporator unit of claim 1, wherein the distance between the crucible and the bore (B) on the hollow body is of a dimension that the crucible is capable of covering a coating range wider than its range without rotation.

5. A method of operating the unit according to claim 1, comprising changing the evaporator position is during or between the application of a coating.

6. A method of operating the unit according to claim 2, comprising changing the evaporator position during or between the application of a coating.

7. The electron beam evaporator unit of claim 1, wherein said carrier plate is held bore (B) by a counter plate and flange, wherein the counter plate is rotatable in said flange.

8. The electron beam evaporator unit of claim 7, wherein said flange is attached to a vacuum tank by screws.

9. The electron beam evaporator unit of claim 7, wherein said counter plate is rotatable in said flange when screws are loosened to a degree sufficient to permit free rotation of said carrier plate.

* * * * *